United States Patent [19]

Wichmann et al.

[11] Patent Number: 4,808,867
[45] Date of Patent: Feb. 28, 1989

[54] DETECTING LOCAL OVERHEATING IN LIQUID-COOLED WINDINGS OF ELECTRIC MACHINES

[75] Inventors: Arnold Wichmann, Mülheim/Ruhr; Peter Grunewald, Essen, both of Fed. Rep. of Germany

[73] Assignee: Siemens Aktiengesellschaft, Berlin and Munich, Fed. Rep. of Germany

[21] Appl. No.: 1,344

[22] Filed: Jan. 8, 1987

[30] Foreign Application Priority Data

Jan. 9, 1986 [DE] Fed. Rep. of Germany ....... 3600421

[51] Int. Cl.⁴ ..................... G01N 25/14; G01R 31/08; H02K 9/24; H02K 9/20
[52] U.S. Cl. .................................... 310/68 C; 310/54; 310/260
[58] Field of Search ............................ 73/40.5 A, 590; 116/264; 174/11 R; 310/10, 54, 56, 68 R, 68 B, 68 C, 260, 53; 324/512, 535, 547; 340/584, 603, 648; 361/37; 374/5, 117, 152

[56] References Cited

U.S. PATENT DOCUMENTS

| | | | |
|---|---|---|---|
| 2,518,518 | 8/1950 | Beldi | 324/54 |
| 3,626,282 | 12/1971 | Brewer | 324/52 |
| 3,755,702 | 8/1973 | Willyoung | 310/54 |
| 4,466,746 | 8/1984 | Hancock et al. | 324/73 PC |

FOREIGN PATENT DOCUMENTS

| | | |
|---|---|---|
| 0080640 | 6/1983 | European Pat. Off. . |
| 327462 | 3/1958 | Switzerland . |
| 573184 | 2/1976 | Switzerland . |

*Primary Examiner*—Patrick R. Salce
*Assistant Examiner*—D. L. Rebsch
*Attorney, Agent, or Firm*—Herbert L. Lerner; Laurence A. Greenberg

[57] ABSTRACT

A method for determining overheating in liquid-cooled windings of electric machines includes acoustically monitoring cooling liquid with at least one sound pickup, and detecting noises generated by bubbles in the event of local overheating if the boiling point of the cooling liquid is exceeded. An apparatus is also provided for carrying out the method.

17 Claims, 2 Drawing Sheets

DETECTING LOCAL OVERHEATING IN LIQUID-COOLED WINDINGS OF ELECTRIC MACHINES

The invention relates to a method for detecting local overheating in liquid-cooled windings of electric machines, as well as apparatus for carrying out the method. Local overheating of coolant-cooled windings can be caused, in particular, by clogging or partial clogging of conductor sections of the windings. The coolant, which in most cases is water, can then no lnger remove the heat generated in this region, so that this region is overheated, which can lead to serious secondary damage.

For instance, in electric machines it has been customary heretofore to attach slot thermometers for controlling the winding temperature and to attach thermocouples at the grounded ends of the coolant connections of the individual conductors in the cases of liquid-cooled windings, so as to monitor the temperatures there. Both methods are relatively costly and their sensitivity is not particularly high since, for instance, if only one conductor section is clogged, the local temperature change is initially hardly noticeable from the outside.

Another monitoring method is carried out by using a so-called Generator Condition Monitor which indicates the gases and particles produced which stem from overheated insulating materials. However, as a rule this indication occurs too late since the damage must have advanced greatly before this monitoring method responds. Furthermore, reliable localization of the location of the damage is not possible with this method.

It is accordingly an object of the invention to provide a method and apparatus for detecting and localizing local overheating in liquid-cooled windings of electric machines, which overcomes the aforementioned disadvantages of the heretofore-known methods and devices of this general type.

With the foregoing and other objects in view there is provided, in accordance with the invention, a method for determining overheating in liquid-cooled windings of electric machines, which comprises acoustically monitoring cooling liquid with at least one sound pickup, and determining noises generated by bubbles forming in the case of local overheating if the boiling point of the cooling liquid is exceeded, followed by dissolving.

The invention starts from the insight that upon the occurrence of local overheating, the cooling liquid, generally water, is heated at the damaged location until boiling, so that bubbles are generated which are dissolved again at cooler places. These bubbles cause characteristic noises which propagate in the liquid and possibly also in the structure forming the cooling loop.

According to the invention, the cooling liquid is acoustically monitored by means of one or more sound pickups, so that in the case of damage, the bubble noises can be detected directly.

In accordance with another mode of the invention, there is provided a method which comprises carrying out the acoustical monitoring step with at least two mutually spaced apart sound pickups, and additionally measuring propagation time differences of possible bubble noises, permitting localization of the point of overheating. This method additionally offers the possibility of rather accurate localization of the point of damage.

In accordance with a further mode of the invention, there is provided a method which comprises filtering out sound signals generated in trouble-free operation of the electric machine with frequency-selective filters, and further processing only typical frequencies of the bubble noises.

Since the sound velocity in the coolant is generally known or easily measurable, the location of the origin of the bubble noises can be calculated from the propagation time differences with which they arrive at the individual sound pickups. Unambiguous localization is already possible with three sound pickups. Since every cooling loop also generates noises that could interfere with the monitoring during disturbance-free operation, it is therefore proposed to filter these sound signals, to monitor only the typical frequencies of the bubble noises and to process them further. It has been found that the bubble noises can be detected particularly significantly in a frequency range below 1 kHz and preferably with pronounced harmonic components of about 300 Hz, since they distinctly differ there from the remaining noise level.

In accordance with an added mode of the invention, there is provided a method which comprises carrying out the acoustical monitoring step with sound pickups disposed in a cooling liquid or in a coolant line. In the latter case it might be necessary to differentiate between the sound waves conducted by the structure and the sound waves transmitted through the liquid, although this does not present basic difficulties. In order to carry out the method, there is also provided an apparatus for detecting overheating in liquid-cooled windings of electric machines or a device for monitoring the stator winding bars of a generator, comprising a coolant loop of the electric machine carrying coolant, at least one sound pickup disposed at the coolant loop and acoustically coupled to the coolant or to the coolant loop, and an electronic evaluating circuit connected to the at least one sound pickup for selecting and indicating bubble noises.

In accordance with another feature of the invention, the electronic evaluating circuit includes frequency-selective filters passing only frequencies typical of bubble noises.

In accordance with a further feature of the invention, the frequency-selective filters are bandpass filters preferably for frequencies in the range of the bubble noises and their harmonics especially in the frequency range below 1 kHz.

In accordance with an added feature of the invention, the at least one sound pickup is in the form of at least two and preferably three sound pickups, and the electronic evaluating circuit includes means for measuring propagation time differences between bubble noises arriving at the sound pickups.

In accordance with an additional feature of the invention, the at least one sound sound pickup is in the form of at least one hydrophone or similar sound-pressure pickup.

In accordance with a concomitant feature of the invention, the liquid cooled winding is the stator winding of a generator having coolant ring manifolds, and the at least one sound pickup is disposed at least at or in one of the coolant ring manifolds and preferably the at least one sound pickup is in the form of three equally spaced apart sound pickups in at least one of the coolant ring manifolds.

Other features which are considered as characteristic for the invention are set forth in the appended claims.

Although the invention is illustrated and described herein as embodied in a method and apparatus for detecting and localizing local overheating in liquid-cooled windings of electric machines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
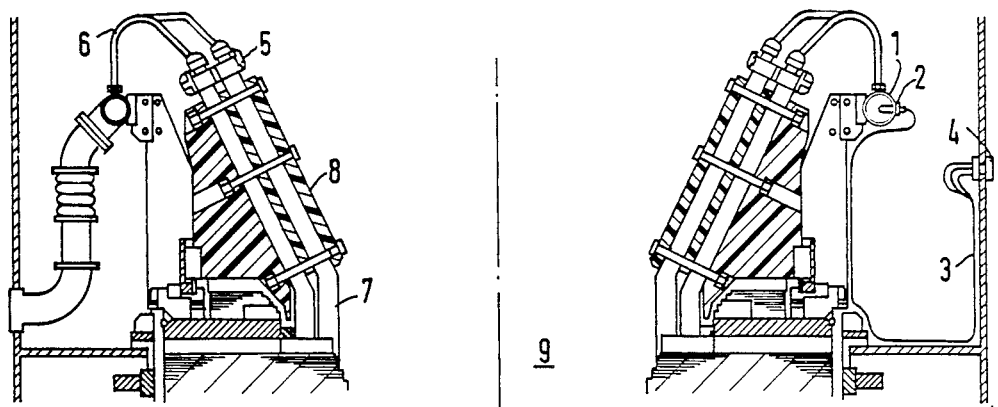
FIG. 2 is a longitudinal-sectional view taken along the line II—II in FIG. 1, in the direction of the arrows.
Figure 1:
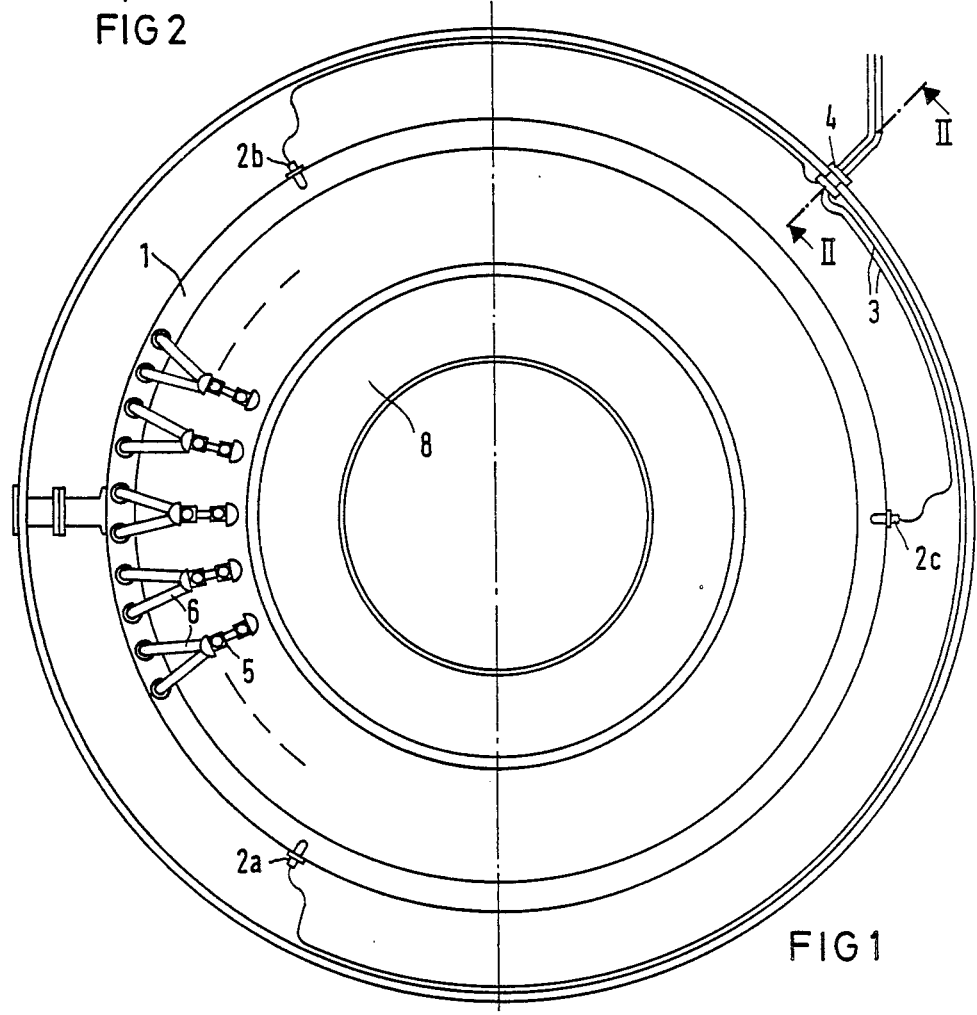
FIG. 1 is a diagrammatic, end-elevational view of an end face or surface of a water-cooled stator winding of a generator.

Referring now to the figures of the drawings in detail and first, particularly, to FIG. 1 thereof, there is seen a greatly simplified presentation of an end-elevational view of the stator winding of a generator, including the parts which are important for an understanding of the invention. FIG. 2 shows a corresponding longitudinal section taken through the end face or surface region of the generator along the line II—II in FIG. 1. Stator winding bars 7 of the generator stator are permeated by a coolant, which in the illustrated embodiment is water. The coolant flows from a first water ring manifold 1, through a hose connection 6, into the stator winding bars 7 and after leaving the stator winding bars 7, it again flows through a hose connection 6, to a second water ring manifold 1, from where it is returned to circulation. The ends of the stator winding bars 7 are located between coil-end cover plates 8 and may have connections 5. According to the illustrated embodiment of the invention, the inlet and outlet sides of one or both of the water ring manifolds are equipped with acoustical sound pickups or receivers 2a, 2b, 2c at a total of at least three points, preferably at equal mutual spacings. The sound pickups may be in the form of hydrophones or other sound pressure pickups and are acoustically coupled to the liquid so that sound waves propagating in the liquid can be converted into electrical signals. The signals are conducted over electric lines 3 through a water-tight feedthrough 4 to an electronic evaluating circuitry.

Figure 3:
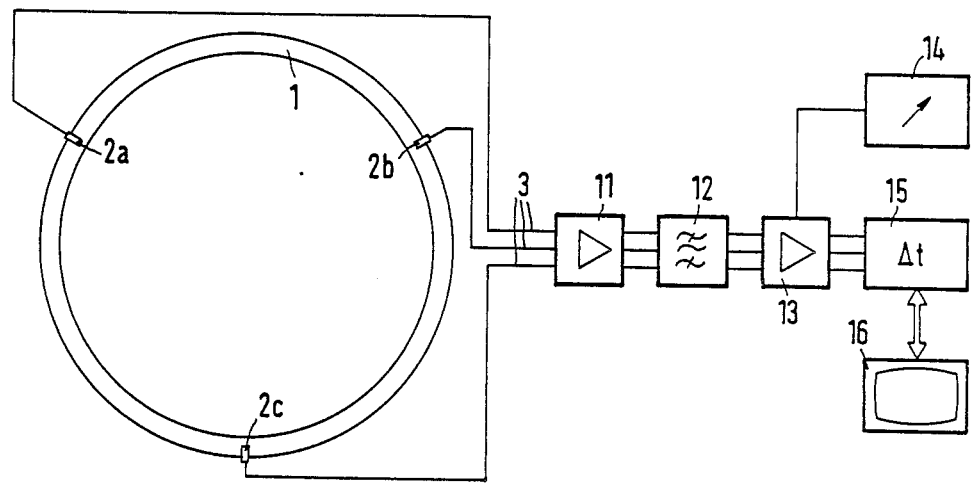
FIG. 3 is a block circuit diagram of an electronic measuring and evaluating system connected to the device.

The further processing of the electrical signals in the electronic evaluating circuitry is shown schematically in FIG. 3. Each signal of each sound pickup 2a, 2b, 2c is first amplified in an amplifier 11 and subsequently stripped of interfering background noises in a bandpass filter 12. Upon the occurrence of bubble noises which can pass through the bandpass filter 12, the signals are amplified further in an amplifier 13 and passed on to an indicating or warning device 14, for instance, in a control room. At the same time, propagation time differences $\Delta t$ between the signals registered by the individual sound pickups can be determined in an analyzer unit 15. In the simplest case, this unit works like a stop watch, i.e., it is started by the first arriving bubble noise and is stopped when the bubble noise from the second or third sound pickup arrives. For a more accurate measurement, a time correlation between the signals arriving from the individual sound pickups can also be formed. The defective winding bar from which the noises emanate, can be detected immediately from the resulting propagation time differences. The defective winding bar is always located in the sector between the two sound pickups at which the signal first arrived; the propagation time difference between these two pickups and their sign in conjunction with the sound velocity immediately permits accurate localization. If the propagation time differences from the third sound pickup are included, knowledge of the sound velocities is not even necessary since the latter is obtained directly from the given mutual spacing of the sound pickups and the additionally measured propagation time difference. The information regarding the location of the damage can then be read out, for instance through a monitor 16.

Figure 4:
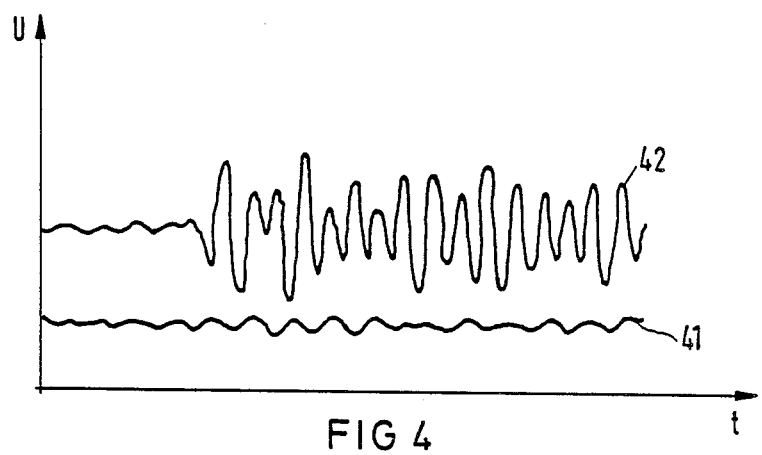
FIG. 4 is a graph of sound signals from the cooling system of a generator winding, as recorded by a recorder.

In order to illustrate the sensitivity of the measuring method, FIG. 4 shows sound signals from the cooling system of a generator winding, which are picked up by a hydrophone at the water ring manifold and recorded by a recorder. The signal voltage U versus the time t is plotted in FIG. 4. A lower curve 41, which is offset for clarity of illustration, shows the zero level of the undisturbed operating noises in the frequency range of about 200 Hz to 300 Hz. An upper curve 42 shows the sound level when bubbles occur in the same frequency band. A very precise and fast differentiation of the bubble noises from the zero level in this frequency range is accordingly possible, so that the monitoring becomes very sensitive.

The foregoing is a description corresponding in substance to German Application No. P 36 00 421.9, dated Jan. 9, 1986, the International priority of which is being claimed for the instant application, and which is hereby made part of this application. Any material discrepancies between the foregoing specification and the aforementioned corresponding German application are to be resolved in favor of the latter.

I claim:

1. Method for determining overheating in liquid-cooled windings of electric machines, which comprises acoustically monitoring cooling liquid with at least two mutually spaced apart sound pickups, determining noises generated by bubbles forming in the case of local overheating if the boiling point of the cooling liquid is exceeded and noises generated by bubbles dissolving again, and additionally measuring propagation time differences of possible bubble noises, permitting localization of the point of overheating.

2. Apparatus for detecting overheating in liquid-cooled windings of electric machines, comprising a coolant loop of the electric machine carrying coolant, at least one sound pickup disposed at said coolant loop and acoustically coupled to the coolant, and an electronic evaluating circuit connected to said at least one sound pickup forming means for selecting and indicating noises caused by bubbles forming and dissolving again, the liquid cooled winding being the stator winding of a generator having coolant ring manifolds, and said at least one sound pickup being disposed at least at one of the coolant ring manifolds.

3. Method according to claim 1, which comprises filtering out sound signals generated in trouble-free operation of the electric machine with frequency-selective filters, and further processing only typical frequencies of the bubble noises.

4. Method according to claim 1, which comprises carrying out the acoustical monitoring step with sound pickups disposed in a cooling liquid.

5. Method according to claim 1, which comprises carrying out the acoustical monitoring step with sound pickups disposed in a coolant line.

6. Apparatus for detecting overheating in liquid-cooled windings of electric machines, comprising a coolant loop of the electric machine carrying coolant, three sound pickups disposed at said coolant loop and acoustically coupled to the coolant, and an electronic evaluating circuit connected to said at least one sound pickup forming means for selecting and indicating noises caused by bubbles forming and dissolving again, said electronic evaluating circuit including means for measuring propagation time differences between bubble noises arriving at said sound pickups.

7. Apparatus for detecting overheating in liquid-cooled windings of electric machines, comprising a coolant loop of the electric machine carrying coolant, at least two sound pickups disposed at said coolant loop and acoustically coupled to the coolant, and an electronic evaluating circuit connected to said at least one sound pickup forming means for selecting and indicating noises caused by bubbles forming and dissolving again, said electronic evaluating circuit including means for measuring propagation time differences between bubble noises arriving at said sound pickups.

8. Apparatus according to claim 6, wherein said electronic evaluating circuit includes frequency-selective filters passing only frequencies typical of bubble noises.

9. Apparatus according to claim 8, wherein said frequency-selective filters are bandpass filters.

10. Apparatus according to claim 8, wherein said frequency-selective filters are bandpass filters for frequencies in the range of the bubble noises and their harmonics.

11. Apparatus according to claim 8, wherein said frequency-selective filters are bandpass filters for frequencies in the range of the bubble noises and their harmonics in the frequency range below 1 kHz.

12. Apparatus according to claim 7, wherein said at least two sound pickups are acoustically coupled to said coolant loop.

13. Apparatus for detecting overheating in liquid-cooled windings of electric machines, comprising a coolant loop of the electric machine carrying coolant, at least one sound pickup disposed at said coolant loop and acoustically coupled to the coolant, and an electronic evaluating circuit connected to said at least one sound pickup forming means for selecting and indicating noises caused by bubbles forming and dissolving again, the liquid cooled winding being the stator winding of a generator having coolant ring manifolds, and said at least one sound pickup being in the form of three equally spaced apart sound pickups in at least one of the coolant ring manifolds.

14. Apparatus according to claim 7, wherein said at least two sound pickups are in the form of at least two hydrophones.

15. Apparatus according to claim 12, wherein said at least two sound pickups are in the form of at least two sound-pressure pickups.

16. Apparatus according to claim 6, wherein said at least two sound pickups are acoustically coupled to said coolant loop.

17. Apparatus according to claim 6, wherein said electronic evaluating circuit includes frequency-selective filters passing only frequencies typical of bubble noises.

* * * * *